United States Patent [19]
Chen et al.

[11] Patent Number: 5,966,323
[45] Date of Patent: Oct. 12, 1999

[54] LOW SWITCHING FIELD MAGNETORESISTIVE TUNNELING JUNCTION FOR HIGH DENSITY ARRAYS

[75] Inventors: Eugene Chen, Gilbert; Mark Durlam, Chandler; Saied N. Tehrani, Tempe, all of Ariz.

[73] Assignee: Motorola, Inc., Schaumburg, Ill.

[21] Appl. No.: 08/993,768

[22] Filed: Dec. 18, 1997

[51] Int. Cl.⁶ .................................................. G11C 11/00
[52] U.S. Cl. ........................... 365/158; 365/171; 365/173
[58] Field of Search ................................ 365/158, 171, 365/173; 360/113, 119

[56] References Cited

U.S. PATENT DOCUMENTS

| | | | |
|---|---|---|---|
| 5,173,873 | 12/1992 | Wu et al. | 365/173 |
| 5,745,406 | 4/1998 | Yamane et al. | 365/158 |
| 5,745,408 | 4/1998 | Chen et al. | 365/173 |
| 5,768,181 | 6/1998 | Zhu et al. | 365/158 |
| 5,768,183 | 6/1998 | Zhu et al. | 365/171 |

*Primary Examiner*—Son Mai
*Attorney, Agent, or Firm*—Eugene A. Parsons; William E. Koch

[57] ABSTRACT

A low switching field magnetoresistive tunneling junction memory cell including a first exchange coupled structure having a pair of magnetoresistive layers and an exchange interaction layer sandwiched therebetween so as to pin the magnetic vectors of the pair of layers anti-parallel, a second exchange coupled structure having a pair of magnetoresistive layers and an exchange interaction layer sandwiched therebetween so as to pin the magnetic vectors of the pair of layers anti-parallel, and electrically insulating material sandwiched between the first and second exchange coupled structures to form a magnetoresistive tunneling junction. Each of the first and second exchange coupled structures, and hence the memory cell, has no net magnetic moment.

12 Claims, 3 Drawing Sheets

LOW SWITCHING FIELD MAGNETORESISTIVE TUNNELING JUNCTION FOR HIGH DENSITY ARRAYS

FIELD OF THE INVENTION

The present invention pertains to magnetoresistive tunneling junctions for memory cells and more specifically to very small tunneling junctions for very high density arrays of memory cells.

BACKGROUND OF THE INVENTION

A magnetic random access memory (MRAM) is a nonvolatile memory which basically includes a giant magnetoresistive (GMR) material or magnetoresistive tunneling junction (MTJ) structure, a sense line, and a word line. The MRAM employs the GMR effect to store memory states. Magnetic vectors in one or all of the layers of GMR material or MTJ are switched very quickly from one direction to an opposite direction when a magnetic field is applied to the GMR material over a certain threshold. According to the direction of the magnetic vectors in the GMR material or MTJ, states are stored, for example, one direction can be defined as a logic "0", and another direction can be defined as a logic "1". The GMR material or MTJ maintains these states even without a magnetic field being applied. The states stored in the GMR material or MTJ can be read by passing a sense current through the cell in a sense line because of the difference between the resistances of the two states.

In very high density arrays of magnetic memory cells the size of individual cells becomes very small if the array is constructed small enough to be useful in present day electronic devices. As the size of individual cells becomes smaller the aspect ratio (length/width ratio) generally becomes smaller. In two layer magnetic memory cells, e.g. standard tunneling cells, as the aspect ratio goes below 5, magnetic vectors in the cells are antiparallel in nonenergized (zero magnetic field) conditions. In a copending application entitled "Multi-Layer Magnetic Memory Cells with Improved Switching Characteristics", Ser. No. 08/723,159, filed on Sep. 25, 1996, and assigned to the same assignee, methods of reading cells with antiparallel magnetic vectors are disclosed. Also, in a copending application entitled "Magnetic Device Having Multi-Layer s with Insulating and Conductive Layers", Ser. No. 08/834,968, filed on Apr. 7, 1997, and assigned to the same assignees, a dummy magnetic layer is added to a two magnetic layer stack and coupled to one of the two magnetic layers so that the other magnetic layer is a free layer. A drawback of the dummy magnetic layer approach is that it relies on cancellation of magnetostatic interaction between the two magnetic layers and this magnetostatic interaction strength depends on the geometry of the cell and the interlayer spacing. These parameters change as the critical dimension shrinks.

Also, in two layer magnetic memory cells, e.g. standard tunneling cells, as the aspect ratio goes below 5, the amount of magnetic field required for switching states of the cell increases dramatically.

Further, as cell density increases, magnetic interaction between adjacent cells becomes a greater problem.

Accordingly, it is highly desirable to provide magnetic random access memories and memory cells which are capable of being written (stored states switched) with less magnetic field.

It is another purpose of the present invention to provide a new and improved multi-state, multi-layer magnetic memory cell with ferromagnetically coupled magnetic layers which produces less magnetic interaction with adjacent cells in an array.

It is still another purpose of the present invention to provide a new and improved multi-state, multi-layer magnetic memory cell with ferromagnetically coupled magnetic layers which can be fabricated very small and with an aspect ratio less than 5.

It is a still further purpose of the present invention to provide a new and improved multi-state, multi-layer magnetic memory cell which is simpler to manufacture and to use.

It is also a purpose of the present invention to provide a new and improved multi-state, multi-layer magnetic memory cell which, because of its size, results in a high density array of cells.

SUMMARY OF THE INVENTION

The above problems and others are at least partially solved and the above purposes and others are realized in a low switching field magnetoresistive tunneling junction memory cell including a first exchange coupled multi-layer structure having a pair of magnetoresistive layers with an exchange interaction layer situated in parallel juxtaposition between the pair of magnetoresistive layers. The pair of magnetoresistive layers in the first structure each have a magnetic vector and the magnetic vectors are always pinned anti-parallel by coupling of the exchange interaction layer. The cell further includes a second exchange coupled multi-layer structure having a pair of magnetoresistive layers with an exchange interaction layer situated in parallel juxtaposition between the pair of magnetoresistive layers. The pair of magnetoresistive layers in the second structure each have a magnetic vector and the magnetic vectors are always pinned anti-parallel by coupling of the exchange interaction layer. Also, electrically insulating material is situated in parallel juxtaposition between the first and second exchange coupled multi-layer structures to form a magnetoresistive tunneling junction. Each of the first and second structures have no net magnetic moment and, hence, the memory cell has no net magnetic moment so that it can be positioned closer to adjacent cells without affecting adjacent cells.

BRIEF DESCRIPTION OF THE DRAWINGS

Referring to the drawings

DESCRIPTION OF THE PREFERRED EMBODIMENT

Figure 1:
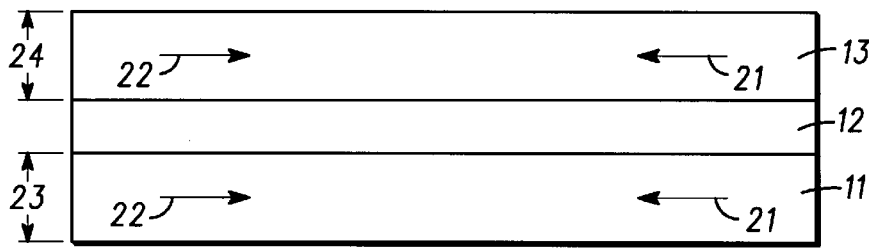
FIG. 1 is a simplified side view of a multi-layer tunneling magnetic memory cell.

Turning now to the drawings, FIG. 1 illustrates an enlarged, simplified side view of a magnetic memory cell 10 having multiple layers that are ferromagnetically coupled. A simplified cell 10 is included for purposes of explaining the operation of tunneling junctions and especially tunneling junctions with low aspect ratios. Cell 10 includes a first magnetic layer 11 and a second magnetic layer 13, which are separated by an insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most non-conductive materials such as oxides, nitrides, dielectrics, etc.

Although shown as a single tunneling junction (two magnetic layers and an insulating layer) in this embodiment, cell 10 can have more than a single tunneling junction including third and fourth magnetic layers (not shown), that typically are similar to layers 11 and 13 but may be formed of different materials or have different thicknesses, and are separated by non-conductive spacer layers, (not shown) that are similar to layer 12.

In prior art structures, layers 11 and 13 are rectangular and each have magnetization vectors 21 that are positioned substantially along the length of the cell and maintained parallel to the length by the physical anisotropy. To achieve this, the width is formed to be smaller than the width of the magnetic domain walls or transition width within layers 11 and 13 and, consequently, vectors 21 can not be parallel to the width. Typically, widths of less than 1.0 to 1.2 microns result in such a constraint. Generally, to achieve high density the width is less than one micron and is as small as can be made by manufacturing technology, and the length is greater than the width. Also, thicknesses 23 and 24 are approximately three to ten nanometers and thicknesses 23 and 24 may be different in some embodiments. The difference in thicknesses 23 and 24 affect the switching points of layers 11 and 13 and are utilized in some structures for reading and writing cells.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this example when vectors 21 of layers 11 and 13 both point to the left in FIG. 1, cell 10 is in a logic "1" state and when vectors 22 in both layers 11 and 13 are in the opposite direction cell 10 is in a logic "0" state. Thus, for a first state, magnetization vectors in both layers 11 and 13 point in a first direction and for a second state, magnetization vectors in both layers 11 and 13 point in an opposite direction. Also, because layers 11 and 13 are ferromagnetically coupled the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

Figure 2:
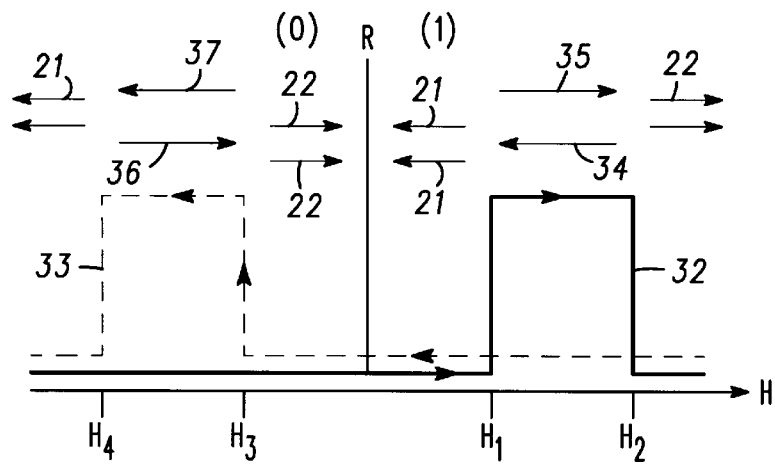
FIG. 2 is a graph generally illustrating switching characteristics of the cell of FIG. 1.

In a tunneling junction type of magnetic cell, layer 12 is an insulating layer, the provision of which between ferromagnetic layers 11 and 13 produces a tunneling junction that allows a flow of current perpendicularly through layer 12, from layer 11 to layer 13 (or vice versa). Essentially, cell 10 appears as a relatively high impedance (referred to herein as a resistance R), which has dependence on the square area of the cell and the dielectric structure, generally several thousand ohms, e.g. 5 to 6 kohms. When the magnetization vectors in layers 11 and 13 are antiparallel the resistance R of cell 10 remains very high. When the magnetization vectors in layers 11 and 13 are parallel, the resistance R of cell 10 drops perceptibly, as illustrated in FIG. 2.

In a specific example, layer 11 is formed of cobalt (Co) approximately 50 Å thick, layer 12 is formed of aluminum oxide ($Al_2O_3$) approximately 20 Å thick, and layer 13 is formed of nickel iron (NiFe) approximately 50 Å thick. The change of resistance versus the resistance ($\Delta R/R$) is approximately 15% in the present specific example. Thus, the state of cell 10 is relatively easily sensed by passing a sense current therethrough from layer 11 to layer 13 (or vice versa). The change of resistance in cell 10 is easily read as a change in voltage drop across cell 10 which can conveniently be used in conjunction with memory arrays and the like. Utilizing the ratio $\Delta R/R=15\%$, it is clear that the change in voltage across cell 10 versus the voltage across cell 10 ($\Delta V/V$) becomes 15%. Thus, in this example in which the resistance of cell 10 is 6 kohms, the change of voltage ($\Delta V$) across cell 10 is approximately 90 mV for a 0.1 mA sensing current passing through cell 10.

Figure 3:
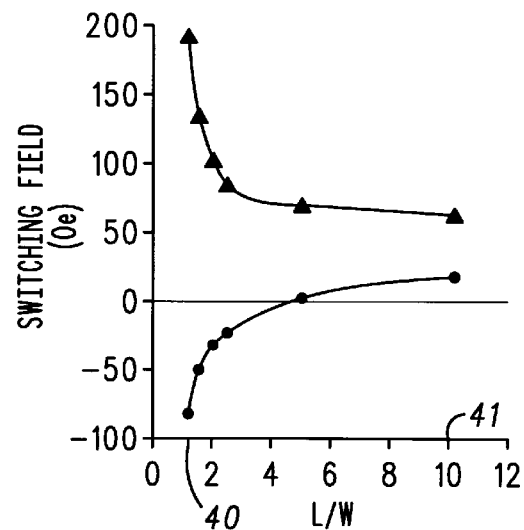
FIG. 3 is a graph illustrating the actual magnetic field required to switch the upper and lower layers, respectively, versus the length/width ratio of a magnetic cell, such as the cell illustrated in FIG. 1, with a fixed width.

Referring now to FIG. 3, the graph illustrated shows actual magnetic fields required to switch states of upper magnetic layer 13 and lower magnetic layer 11, respectively, in magnetic memory cell 10 of FIG. 1 versus the length/width ratio of the magnetic cell. The graph illustrated in FIG. 3 is developed using magnetic cells, such as cell 10 of FIG. 1, with a fixed width which in this specific example is 0.4 micrometers. Also, the length of the magnetic cells utilized to develop the graph of FIG. 3 range between 0.48 micrometers at a point 40 to 4.0 micrometers at a point 41. The graph of FIG. 3 illustrates that a magnetic field with a strength of less than approximately 20 Oersteds is sufficient to switch the state of layer 13 in cell 10 of FIG. 1 if the length/width ratio of cell 10 is in a range of approximately 4.5 to 10. The graph of FIG. 3 also illustrates that a magnetic field with a strength greater than approximately 60 Oersteds is required to switch the state of layer 11 in cell 10 of FIG. 1 if the length/width ratio of cell 10 is in a range of approximately 2 to 10.

An additional feature illustrated in FIG. 3, is that in cells having a length/width ratio of greater than approximately 4 the first and second layers of magnetic material are ferromagnetically coupled while in cells having a length/width ratio of less than approximately 4 the first and second layers of magnetic material are antiferromagnetically coupled. Generally, for purposes of this disclosure the term "ferromagnetically coupled" means that either of the parallel states (magnetic vectors 21 or 22, in FIG. 1) is stable and does not require a constant magnetic field. Also, for purposes of this disclosure the term "antiferromagnetically coupled" means that either of the antiparallel states is stable and that the parallel state is unstable and does require a constant magnetic field, since the magnetic vectors always tend to move to an antiparallel state.

Figure 4:
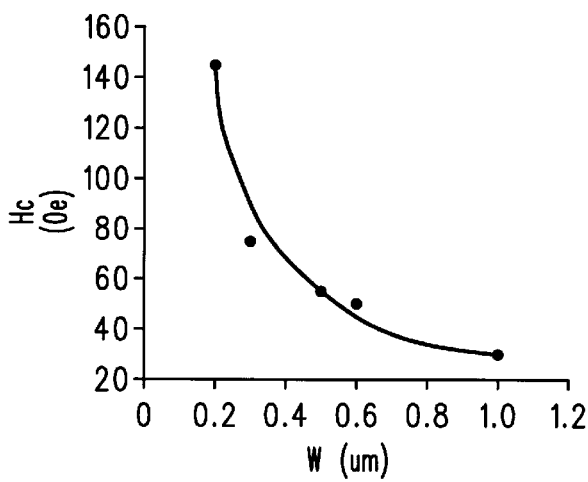
FIG. 4 is a graph illustrating the switching field required to write a cell versus the width of the cell.

Turning now to FIG. 4, a graph illustrating the switching field required to write a cell versus the width of the cell is illustrated. As illustrated in FIG. 4, if a magnetic memory cell has a net magnetic moment and an aspect ratio (i.e. L/W ratio) of one or greater, the switching field and, therefore, the current needed to write the cell, drastically increases as the cell width decreases.

Generally, in a cell of the type illustrated in FIG. 1, the magnetic vector in the bottom magnetic layer (i.e. layer 11) is pinned in some fashion and the magnetic vector in the top magnetic layer (i.e. layer 13) is free to rotate in either direction along the magnetic axis. In addition to the above problems, there are edge domains present in the top free magnetic layer which cause non-repeatability in the switching of the top free magnetic layer. The switching field determines the threshold between different memory states, the tighter its distribution, the better it is. Edge domains also make the magnetic spins in the edge regions of the top and bottom layers not perfectly antiparallel or parallel, therefore, reducing the magnetoresistance ratio or signal from the memory cell.

Figure 5:
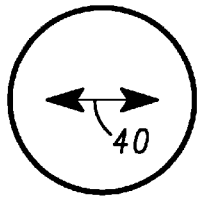
FIGS. 5–7 are plan views of different potential embodiments in accordance with the present invention for magnetic cells having low aspect ratios.
Figure 6:
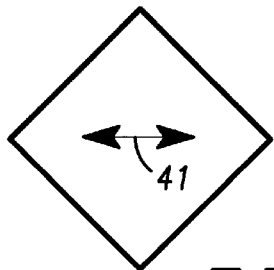
Figure 7:
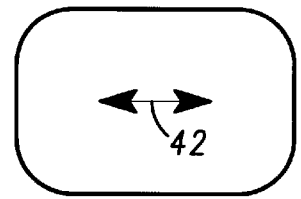

Referring to FIGS. 5–7, plan views of different potential embodiments in accordance with the present invention for magnetic cells having low aspect ratios are illustrated. When the aspect ratio of a single magnetic layer is close to one, such as for circular, square or diamond shaped, or elliptical, its switching field from shape anisotropy is minimum. In the case of circularly shaped cells, as illustrated in FIG. 5, the preferred magnetization direction, represented by a magnetic vector 40, is determined by uniaxial crystal field anisotropy (or magnetic crystalline anisotropy). This preferred magnetization direction is set during film deposition by a bias field or by annealing the film after deposition in a high magnetic field (e.g. several kOe) at elevated temperatures (e.g. 200° C. to 300° C.). In the case of a square or diamond shape, as illustrated in FIG. 6, the uniaxial crystal anisotropy, represented by magnetic vector 41, is set along a diagonal direction of the square. In the case of an elliptically shaped cell, illustrated in FIG. 7, the uniaxial crystal anisotropy, represented by magnetic vector 42, is set along the long axis of the cell. The main idea here is to minimize the shape effect, which contributes to the rise in required switching fields at narrow cell widths, and to utilize magneto-crystalline anisotropy to set the preferred magnetization direction needed by a memory cell.

As explained above, the magnetic moments or magnetic vectors, in a pair of magnetically coupled layers of a magnetic cell prefer to be antiparallel (antiferromagnetically coupled) when the aspect ratio of the cell is less than 5. However, the problem is that the magnetostatic interaction strength depends on the geometry of the cell and the interlayer spacing and these parameters change as critical dimensions shrink. To reinforce the antiferromagnetic coupling, yet insensitive to changes in the geometry, exchange coupled two layer structures as illustrated in FIG. 8 is utilized.

Figure 8:
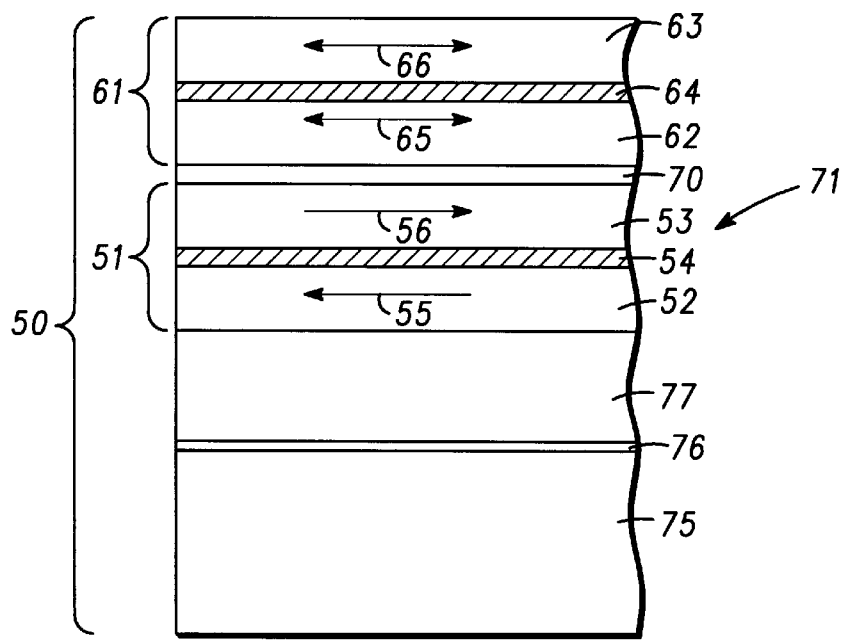
FIG. 8 is a simplified side view of a multi-layer tunneling magnetic memory cell in accordance with the present invention.

Referring specifically to FIG. 8, a simplified cross-sectional view is illustrated of a multi-layer tunneling magnetic memory cell 50 in accordance with the present invention. A first exchange coupled multi-layer structure 51 includes a pair of magnetoresistive layers 52 and 53 having an exchange interaction layer 54 situated in parallel juxtaposition therebetween. Magnetoresistive layers 52 and 53 have magnetic vectors 55 and 56, respectively, which are always pinned anti-parallel (as illustrated in FIG. 8) by coupling of exchange interaction layer 54. A second exchange coupled multi-layer structure 61 includes a pair of magnetoresistive layers 62 and 63 having an exchange interaction layer 64 situated in parallel juxtaposition therebetween. Magnetoresistive layers 62 and 63 have magnetic vectors 65 and 66, respectively, which are always pinned anti-parallel by coupling of exchange interaction layer 64. Electrically insulating material 70 is situated in parallel juxtaposition between first and second exchange coupled multi-layer structures 51 and 61 to form magnetoresistive tunneling junction 71.

Generally, magnetoresistive layers 52/53 and 62/63 are formed of magnetic alloys such as NiFe, CoFe, NiFeCo, pure Ni, Fe, or Co, or other combinations thereof. Also, exchange interaction layers 54 and 64 generally include either pure Ru or some alloy thereof. It should be understood that, as explained above, when the aspect ratio of a magnetically coupled pair of layers is less than 5 the vectors in the pair of layers have a strong tendency to always remain antiparallel. Thus, in at least some specific embodiments the exchange interaction layer may simply be a non-magnetic electrically conductive layer such as copper or the like.

In this preferred embodiment, a supporting substrate 75 is provided, which supporting substrate 75 may be, for example, a semiconductor substrate or wafer and semiconductor control devices may then be formed on supporting substrate 75 in cooperation with cell 50. A seed layer 76 is formed on the surface of supporting substrate 75 to aid in the formation and operation of the remaining layers of material. A layer 77 of antiferromagnetic material is then formed on the surface of seed layer 76. The antiferromagnetic material of layer 77 includes, for example, FeMn, NiMn, IrMn, or combinations thereof. Layer 77 of antiferromagnetic material is utilized to unidirectionally pin magnetic vector 55 of layer 52 of magnetoresistive material along the preferred magnetic axis. That is, vector 55 is pinned in the direction illustrated (i.e. unidirectional) unless sufficient magnetic field is supplied to overcome the pinning action of layer 77. Generally, layer 77 is thick enough to insure that spurious signals and normal cell writing signals will not switch structure 51.

It will of course be understood that seed layer 76 is optional and the illustrated positioning of layer 77 is for fabrication convenience with many other possible configurations available. Therefore, supporting substrate 75, along with seed layer 76 (if present) and layer 77 (if formed on the substrate) are referred to herein simply as a substrate. Further, during fabrication of cell 50 each succeeding layer (i.e. 52, 54, 53, etc.) is deposited or otherwise formed in sequence and each cell may be defined by selective deposition, etching, etc. in any of the techniques known in the semiconductor industry. During deposition of at least the layers 62/63, a magnetic field is provided to set an easy magnetic axis for this pair (magnetocrystalline anisotropy). Also, in the preferred embodiment each cell is formed with an aspect ratio (i.e. L/W ratio) range of 1 to 5 and with a top plan that is one of circular, diamond-shaped, or elliptical (as illustrated in FIGS. 5–7).

In the operation of cell 50, magnetic vector 55 is pinned in a fixed direction by antiferromagnetic material 77. Magnetic vector 56 is maintained antiparallel to vector 55 by the exchange interaction of layer 54. Further, magnetic flux in layers 52 and 53 follows a closed path so that the net magnetic moment of structure 51 is essentially zero. Magnetic vectors 65 and 66 are free to move but they are maintained antiparallel by the exchange interaction of layer 64 and, because of the closed magnetic flux path, the net magnetic moment of structure 61 is essentially zero. Thus, the net magnetic moment of cell 50 is essentially zero and no magnetic field is produced which will affect adjacent cells. Because of the zero, or essentially zero, magnetic moment of cell 50, cells of this type can be positioned very close and the density of an array of these cells can be greatly increased.

Further, in cell 50 the switching field of structure 61 is determined by the magnetocrystalline anisotropy and, therefore, it is width independent. Thus, the aspect ratio can be less than 5 and shapes such as circular, diamond, or elliptical can be used. The magnetocrystalline anisotropy can be tuned to be very low by using different concentrations of materials in magnetic alloys, e.g. $Ni_xFe_yCo_z$, where x, y, and z are variable from 0 to 1, with z+y+z=1. Therefore, high power consumption problems at high densities is greatly reduced. Further, there will not be edge domains in structures 51 and 61 because the magnetic flux is closed and, therefore, switching non-repeatability and magnetoresistance drop problems are greatly reduced also.

Figure 9:
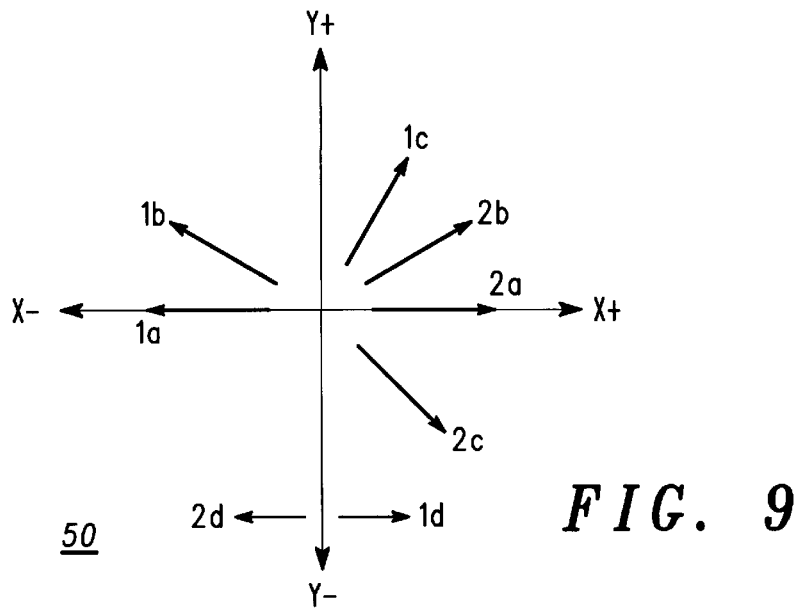
FIG. 9 is a vector diagram illustrating the operation of the cell of FIG. 8.

Turning now to FIG. 9, a vector diagram is shown for illustrating the operation of cell 50 of FIG. 8. Each of the vectors in FIG. 9 are designated with a number and a letter with the number 1 indicating a magnetic vector for magnetic layer 63 and the number 2 indicating a magnetic vector for magnetic layer 62. The letters indicate the movement of each vector with 'a' being an original or starting position and the following letters indicating sequential steps. The easy axis direction is along the X-axis with the hard direction being along the Y-axis. For simplicity of the following discussion, it is assumed that magnetic layer 63 is slightly thicker than magnetic layer 62, which may or may not be true in the actual structure.

Under the magnetic field generated by a positive sense pulse, which field direction is along the Y+ axis, the vectors move from the 1a and 2a directions to the 1b and 2b directions. Under the magnetic field generated by a positive word pulse, which field direction is along the X+ axis, the vectors move from the 1b and 2b directions to the 1c and 2c directions. Subsequently, all pulses are removed. Because layer 63 is slightly thicker than layer 62 and antiferromagnetic coupling is an interface energy, the effective field is inversely proportional to the thickness of the layer. Thus, the switching field for layer 62 is smaller and the antiferromagnetic coupling field is larger (greater effect) on layer 62. Therefore, the vector for layer 62 will be snapped over the magnetocrystalline energy barrier along the Y− direction and then fall into the X− direction, indicated by the 2d position. The vector for layer 63 will simply relax from the 1c to the 1d position because this is the minimum energy direction. Similarly, a positive sense pulse with a negative word pulse will switch the vectors from the 1d and 2d positions back to the 1a and 2a positions, respectively.

Figure 10:
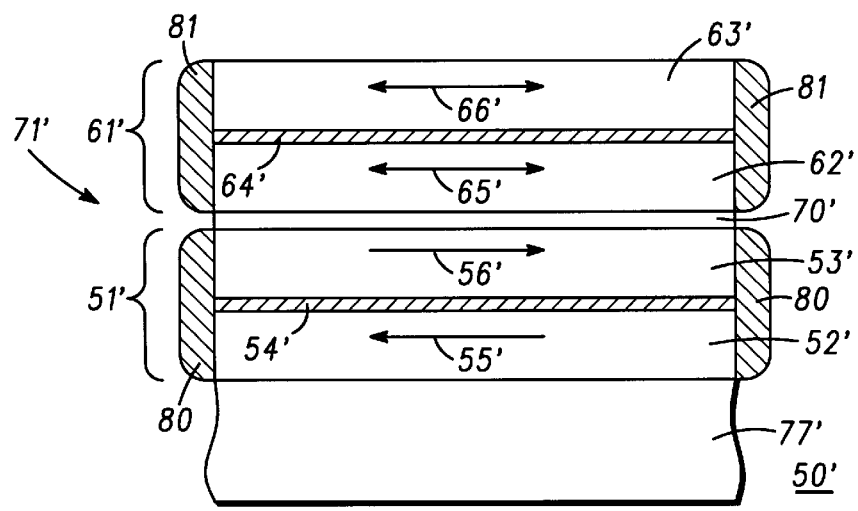
FIG. 10 is a simplified side view of an other multi-layer tunneling magnetic memory cell in accordance with the present invention.

Turning now to FIG. 10 a simplified side view is illustrated of another multi-layer tunneling magnetic memory cell 50' in accordance with the present invention. Cell 50' is similar to cell 50 of FIG. 8 and like numbers designate like components. A first exchange coupled multi-layer structure 51' includes a pair of magnetoresistive layers 52' and 53' having an exchange interaction layer 54' situated in parallel juxtaposition therebetween. Magnetoresistive layers 52' and 53' have magnetic vectors 55' and 56', respectively, which are always pinned anti-parallel (as illustrated in FIG. 9) by coupling of exchange interaction layer 54'. A second exchange coupled multi-layer structure 61' includes a pair of magnetoresistive layers 62' and 63' having an exchange interaction layer 64' situated in parallel juxtaposition therebetween. Magnetoresistive layers 62' and 63' have magnetic vectors 65' and 66', respectively, which are always pinned anti-parallel by coupling of exchange interaction layer 64'. Electrically insulating material 70' is situated in parallel juxtaposition between first and second exchange coupled multi-layer structures 51' and 61' to form magnetoresistive tunneling junction 71'.

In this embodiment, the antiparallel coupling between layers 52' and 53' of structure 51' is reinforced by the addition of flux closure material 80 positioned to enclose exposed edges of layers 52', 53' and 54'. Also, the antiparallel coupling between layers 62' and 63' of structure 61' is reinforced by the addition of flux closure material 81 positioned to enclose exposed edges of layers 62', 63' and 64'. Flux closure material 80 and 81 is any soft magnetic material which encloses flux lines, or completes a magnetic circuit, between the various layers. Soft magnetic material 80 and 81 simply guides magnetic field lines from layers 52'/53' and 62'/63', respectively, into a closed loop to further reduce the magnetic moment and prevent any stray magnetic fields.

Figure 11:
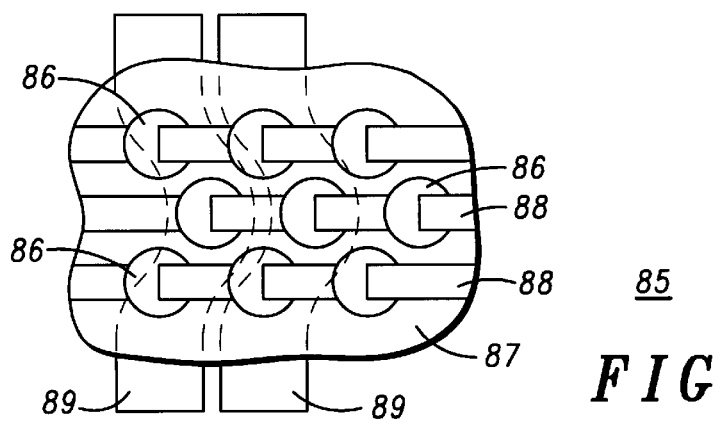
FIG. 11 is a simplified view in top plan of a high density array of multi-layer tunneling magnetic memory cells in accordance with the present invention.

Referring specifically to FIG. 11 a simplified view in top plan is illustrated of a high density array 85 of multi-layer tunneling magnetic memory cells 86 in accordance with the present invention. Array 85 is formed on a substrate structure 87 which may include control electronics and other peripheral equipment, if practical. Also, if an antiferromagnetic layer is included as part of substrate structure 87, the layer may be formed as a blanket layer so as to cooperate with each cell 86. Cells 86 lying in a common row, for example, have the top magnetic layer connected to the bottom magnetic layer of the adjacent cell to form a common sense line 88. Further, word lines 89, illustrated in broken lines, are coupled to cells 86 lying in a common column for purposes of writing information into the cells, as described above.

Thus, new and improved magnetic random access memories and memory cells which are capable of being written (stored states switched) with less magnetic field have been disclosed. Also, the new and improved multi-state, multi-layer magnetic memory cell with ferromagnetically coupled magnetic layers which is disclosed produces less magnetic interaction with adjacent cells in an array and can be fabricated very small and with an aspect ratio less than 5. Further, the new and improved multi-state, multi-layer magnetic memory cell is simpler to manufacture and to use and, because of its size, results in a high density array of cells.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A low switching field magnetoresistive tunneling junction memory cell comprising:

a first exchange coupled multi-layer structure including a pair of magnetoresistive layers having an exchange interaction layer situated in parallel juxtaposition between the pair of magnetoresistive layers, the pair of magnetoresistive layers each having a magnetic vector and the magnetic vectors always being pinned anti-parallel by coupling of the exchange interaction layer;

a second exchange coupled multi-layer structure including a pair of magnetoresistive layers having an exchange interaction layer situated in parallel juxtaposition between the pair of magnetoresistive layers, the pair of magnetoresistive layers each having a magnetic vector and the magnetic vectors always being pinned anti-parallel by coupling of the exchange interaction layer; and electrically insulating material situated in parallel juxtaposition between the first and second exchange coupled multi-layer structures to form a magnetoresistive tunneling junction.

2. A low switching field magnetoresistive tunneling junction memory cell as claimed in claim 1 wherein the first and second exchange coupled multi-layer structures each have a length/width ratio in a range of 1 to 5.

3. A low switching field magnetoresistive tunneling junction memory cell as claimed in claim 2 wherein the first and second exchange coupled multi-layer structures each have a top plan that is one of circular, diamond-shaped, or elliptical.

4. A low switching field magnetoresistive tunneling junction as claimed in claim 1 including in addition antiferromagnetic material positioned adjacent one of the first and second exchange coupled multi-layer structures so as to uni-directionally fix the magnetic vectors in the one of the exchange coupled multi-layer structures.

5. A low switching field magnetoresistive tunneling junction memory cell as claimed in claim 4 wherein the antiferromagnetic material includes FeMn, NiMn, IrMn, or combinations thereof.

6. A low switching field magnetoresistive tunneling junction memory cell as claimed in claim 1 including in addition flux closure material positioned to enclose exposed edges of the first exchange coupled multi-layer structure.

7. A low switching field magnetoresistive tunneling junction memory cell as claimed in claim 1 including in addition flux closure material positioned to enclose exposed edges of the second exchange coupled multi-layer structure.

8. A high density array of low switching field magnetoresistive tunneling junction memory cells comprising:

a substrate with a planar surface; and a plurality of interconnected low switching field magnetoresistive tunneling junction memory cells supported on the planar surface of the substrate and interconnected to form a memory array, each cell of the plurality of cells having an aspect ratio less than 5 and a top plan that is one of circular, diamond-shaped, or elliptical, each cell including a first exchange coupled multi-layer structure with no net magnetic moment including a pair of magnetoresistive layers having an exchange interaction layer situated in parallel juxtaposition between the pair of magnetoresistive layers, the pair of magnetoresistive layers each having a magnetic vector and the magnetic vectors always being pinned anti-parallel by coupling of the exchange interaction layer, a second exchange coupled multi-layer structure with near zero magnetic moment including a pair of magnetoresistive layers having an exchange interaction layer situated in parallel juxtaposition between the pair of magnetoresistive layers, the pair of magnetoresistive layers each having a magnetic vector and the magnetic vectors always being pinned anti-parallel by coupling of the exchange interaction layer, and electrically insulating material situated in parallel juxtaposition between the first and second exchange coupled multi-layer structures to form a magnetoresistive tunneling junction with near zero magnetic moment.

9. A high density array of low switching field magnetoresistive tunneling junction memory cells as claimed in claim 8 wherein the substrate includes a layer of antiferromagnetic material defining the planar surface and the plurality of interconnected low switching field magnetoresistive tunneling junction memory cells are positioned thereon so as to uni-directionally fix the magnetic vectors in an adjacent one of the exchange coupled multi-layer structures.

10. A high density array of low switching field magnetoresistive tunneling junction memory cells as claimed in claim 9 wherein the layer of antiferromagnetic material includes FeMn, NiMn, IrMn, or combinations thereof.

11. A high density array of low switching field magnetoresistive tunneling junction memory cells as claimed in claim 8 including in addition flux closure material positioned to enclose exposed edges of the first exchange coupled multi-layer structure in each cell of the plurality of cells.

12. A high density array of low switching field magnetoresistive tunneling junction memory cells as claimed in claim 8 including in addition flux closure material positioned to enclose exposed edges of the second exchange coupled multi-layer structure in each cell of the plurality of cells.

* * * * *

UNITED STATES PATENT AND TRADEMARK OFFICE
CERTIFICATE OF CORRECTION

PATENT NO.    : 5,966,323
DATED         : October 12, 1999
INVENTOR(S)   : Chen et al.

It is certified that error appears in the above-identified patent and that said Letters Patent is hereby corrected as shown below:

<u>Column 1,</u>
Line 4, after the Title, please add as a new first paragraph the following paragraph:
 -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*